US009214442B2

(12) United States Patent
Guth et al.

(10) Patent No.: US 9,214,442 B2
(45) Date of Patent: Dec. 15, 2015

(54) POWER SEMICONDUCTOR MODULE, METHOD FOR PRODUCING A POWER SEMICONDUCTOR MODULE, AND SEMICONDUCTOR CHIP

(75) Inventors: Karsten Guth, Soest (DE); Holger Torwesten, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 1223 days.

(21) Appl. No.: 11/688,050

(22) Filed: Mar. 19, 2007

(65) Prior Publication Data
US 2008/0230905 A1 Sep. 25, 2008

(51) Int. Cl.
H01L 23/48 (2006.01)
H01L 23/00 (2006.01)
H01L 25/07 (2006.01)

(52) U.S. Cl.
CPC ............... H01L 24/32 (2013.01); H01L 24/29 (2013.01); H01L 24/48 (2013.01); H01L 24/49 (2013.01); H01L 24/83 (2013.01); H01L 24/45 (2013.01); H01L 25/072 (2013.01); H01L 2224/29101 (2013.01); H01L 2224/29111 (2013.01);
(Continued)

(58) Field of Classification Search
CPC ............. H01L 2924/3841; H01L 23/488; H01L 23/492; H01L 24/26; H01L 35/08; H01L 2021/60007–2021/60015; H01L 2021/60097; H01L 2021/60285; H01L 2224/03013; H01L 2224/26; H01L 2224/40491; H01L 2224/80801–2224/8083; H01L 2224/818–2224/8183; H01L 2224/08

USPC ............... 257/686, 690, 693, 708, 69, 751
See application file for complete search history.

(56) References Cited

U.S. PATENT DOCUMENTS 6,727,587 B2   4/2004 Riedl
6,872,465 B2 *  3/2005 Soga et al. ............... 428/570
(Continued)

FOREIGN PATENT DOCUMENTS

EP   0119691 A2   9/1984
EP   0242626 A2   3/1987
(Continued)

OTHER PUBLICATIONS

Yanghua Xia, Xiaoming Xie, Chuanyan Lu, Junling Chang; Journal of Alloys and Compounds, "Coupling Effects at Cu(Ni)-SnAg-Cu(Ni) Sandwich Solder Joint During Isothermal Aging" (2006) pp. 143-149.*
(Continued)

Primary Examiner — Steven Loke
Assistant Examiner — Cuong B Nguyen
(74) Attorney, Agent, or Firm — Murphy, Bilak & Homiller, PLLC

(57) ABSTRACT

In a power semiconductor module, a copper-containing first soldering partner, a connection layer, and a copper-containing second soldering partner are arranged successively and fixedly connected with one another. The connection layer has a portion of intermetallic copper-tin phases of at least 90% by weight. For producing such a power semiconductor module the soldering partners and the solder arranged there between are pressed against one another with a predefined pressure and the solder is melted. After termination of a predefined period of time the diffused copper and the tin from the liquid solder form a connection layer comprising intermetallic copper-tin phases, the portion of which is at least 90% by weight of the connection layer created from the solder layer.

20 Claims, 9 Drawing Sheets

(52) U.S. Cl.
CPC ............ H01L2224/29147 (2013.01); H01L 2224/32225 (2013.01); H01L 2224/45014 (2013.01); H01L 2224/4554 (2013.01); H01L 2224/45147 (2013.01); H01L 2224/45647 (2013.01); H01L 2224/4846 (2013.01); H01L 2224/48091 (2013.01); H01L 2224/48227 (2013.01); H01L 2224/48472 (2013.01); H01L 2224/49111 (2013.01); H01L 2224/73265 (2013.01); H01L 2224/8381 (2013.01); H01L 2224/8382 (2013.01); H01L 2224/83801 (2013.01); H01L 2924/0103 (2013.01); H01L 2924/014 (2013.01); H01L 2924/01004 (2013.01); H01L 2924/0105 (2013.01); H01L 2924/01005 (2013.01); H01L 2924/01006 (2013.01); H01L 2924/01013 (2013.01); H01L 2924/01015 (2013.01); H01L 2924/01019 (2013.01); H01L 2924/01022 (2013.01); H01L 2924/01023 (2013.01); H01L 2924/01028 (2013.01); H01L 2924/01029 (2013.01); H01L 2924/0132 (2013.01); H01L 2924/01033 (2013.01); H01L 2924/01047 (2013.01); H01L 2924/01049 (2013.01); H01L 2924/01051 (2013.01); H01L 2924/01073 (2013.01); H01L 2924/01074 (2013.01); H01L 2924/01079 (2013.01); H01L 2924/01082 (2013.01); H01L 2924/01083 (2013.01); H01L 2924/01327 (2013.01); H01L 2924/04941 (2013.01); H01L 2924/04953 (2013.01); H01L 2924/1517 (2013.01); H01L 2924/15787 (2013.01)

(56) References Cited

U.S. PATENT DOCUMENTS

| | | | |
|---|---|---|---|
| 7,276,801 B2 * | 10/2007 | Dubin et al. | 257/779 |
| 7,670,879 B2 | 3/2010 | Fujimoto et al. | |
| 2005/0218525 A1 | 10/2005 | Takahashi et al. | |
| 2005/0275096 A1 * | 12/2005 | Zeng et al. | 257/737 |
| 2007/0197017 A1 | 8/2007 | Fujimoto et al. | |
| 2008/0083986 A1 * | 4/2008 | Curtis et al. | 257/738 |

FOREIGN PATENT DOCUMENTS

| | | | |
|---|---|---|---|
| EP | 0330895 | A2 | 2/1989 |
| EP | 0764978 | A2 | 8/1996 |
| EP | 0790647 | A2 | 9/1997 |
| GB | 1389542 | | 4/1975 |
| JP | 6252321 | A | 9/1994 |
| JP | 7307354 | A | 11/1995 |
| JP | 11-343594 | * | 12/1999 |
| JP | 11343594 | * | 12/1999 |
| JP | 2000135557 | A | 5/2000 |
| JP | 2004-031771 | * | 1/2004 |
| JP | 2004031771 | * | 1/2004 |
| JP | 2004111936 | A | 4/2004 |
| JP | 2004-179362 | * | 6/2004 |
| JP | 2004179362 | * | 6/2004 |
| JP | 2005288458 | A | 10/2005 |
| JP | 2006140401 | A | 6/2006 |
| WO | 2005086218 | A1 | 9/2005 |

OTHER PUBLICATIONS

Yanghua Xia, Xiaoming Xie; "Coupling Effects at Cu(Ni)-SnAgCu-Cu(Ni) Sandwich Solder Joint During Isothermal Aging"; Sep. 2005; Journal of Alloys and Compounds 417 (2006); pp. 143-149.*

Chin C. Lee, Yi-Chia Chen; "High Temperature Tin-Copper Joints Produced at Low Process Temperature for Stress Reduction"; Dec. 1995; Thin Solid Films 286 (1996); pp. 213-218.*

* cited by examiner

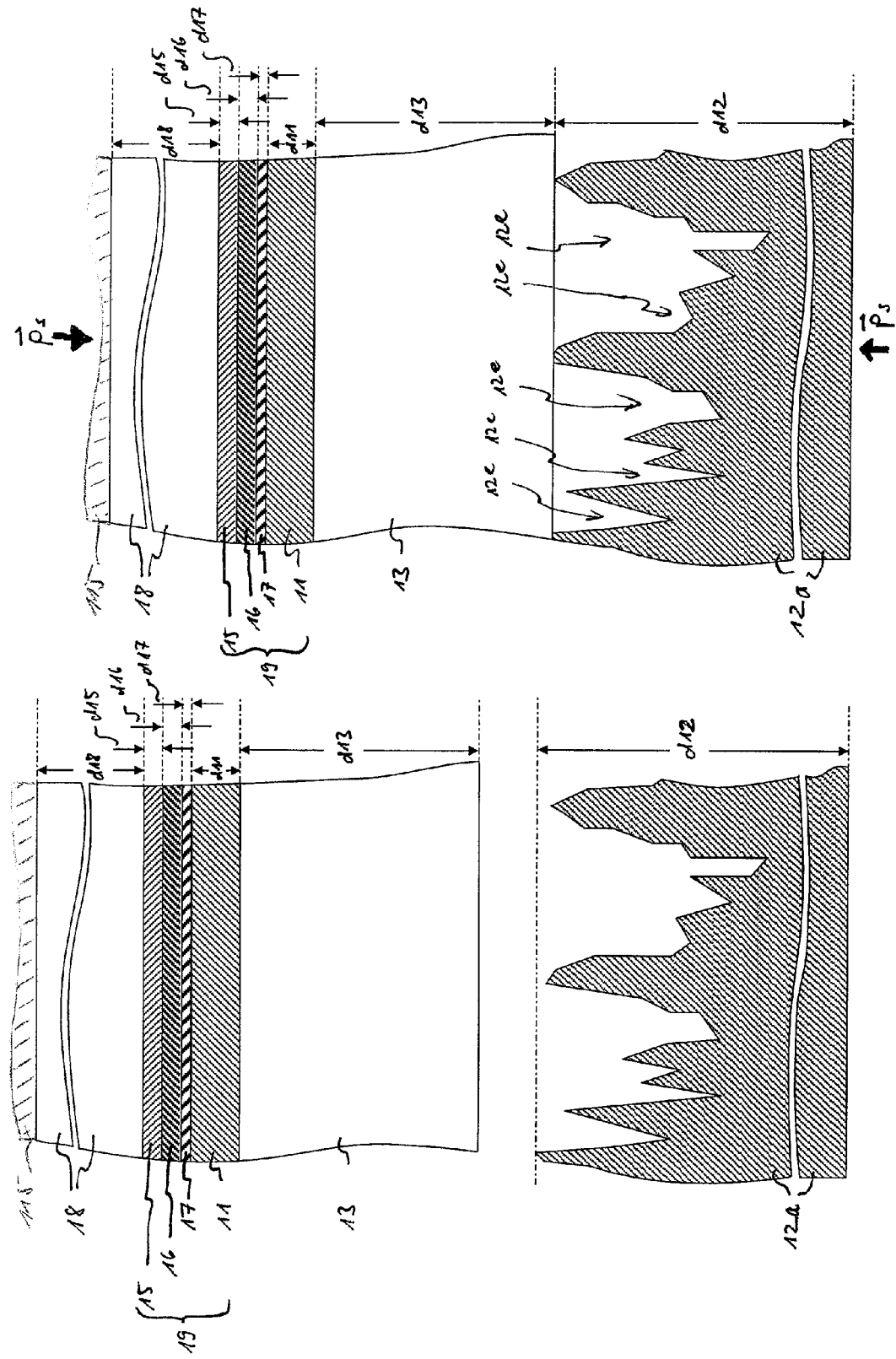

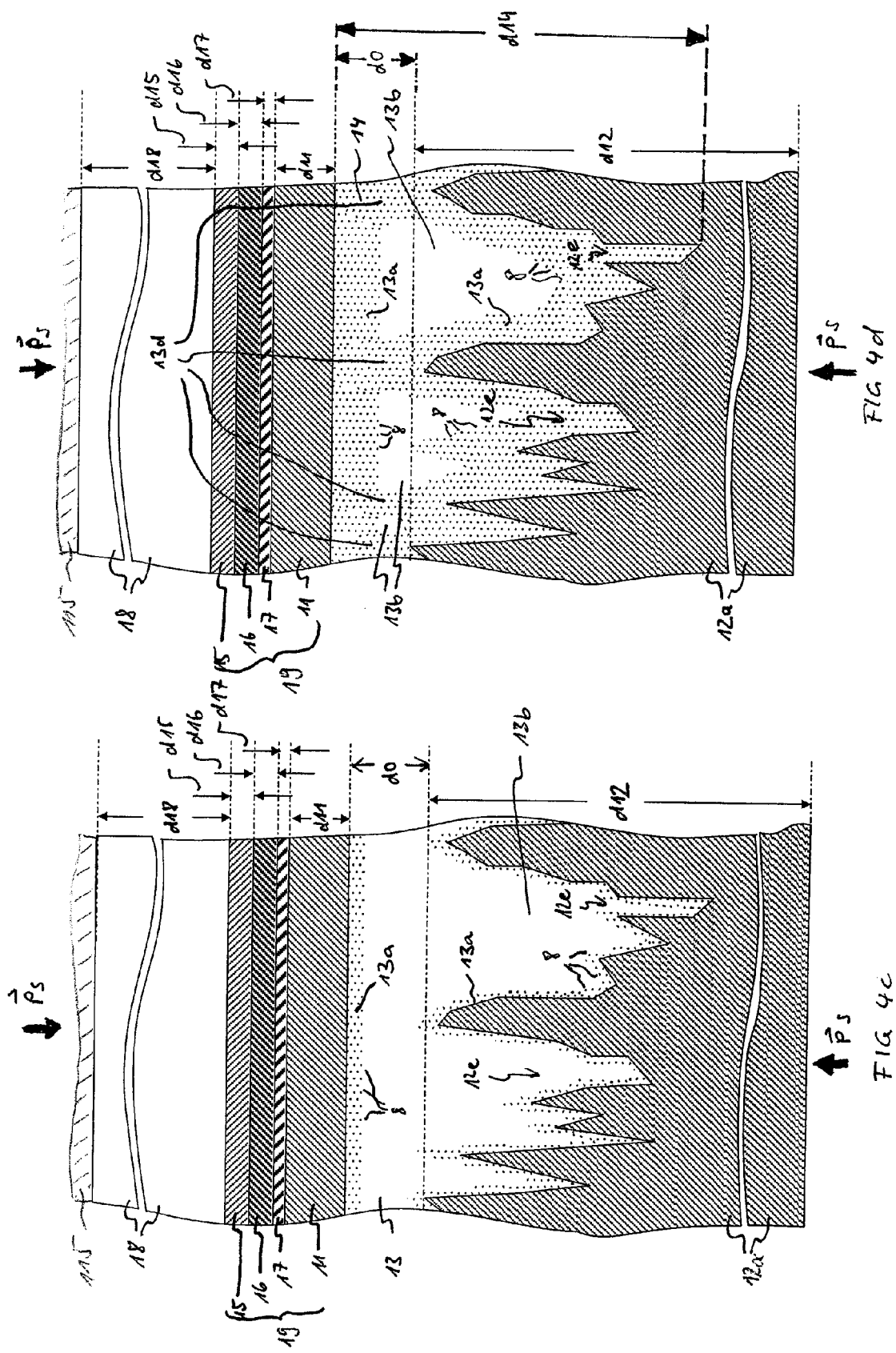

POWER SEMICONDUCTOR MODULE, METHOD FOR PRODUCING A POWER SEMICONDUCTOR MODULE, AND SEMICONDUCTOR CHIP

TECHNICAL FIELD

The invention relates to power semiconductor modules, to a method for producing a power semiconductor module and to semiconductor chips.

BACKGROUND

Power semiconductor modules comprise a number of soldered connections, wherein the most various components must be fixedly and permanently joined with one another. Due to the high temperatures occurring during operation of the power semiconductor modules, as well as due to frequent temperature changes with high temperature shifts, the soldered joints are heavily used, which limits the service life of the power semiconductor modules. Especially if at least one of the soldering partners has large surface roughness, e.g. the metallization of a ceramic substrate, the respective soldering joints are sensitive to temperature cycling. To avoid problems arising with a large surface roughness in many cases the surface of a soldering partner needs to be polished.

SUMMARY

According to an embodiment, in a novel semiconductor power module a copper-containing first soldering partner, a connection layer, and a copper-containing second soldering partner are arranged successively and fixedly connected with one another, wherein the first soldering partner has a first surface directly abutting against the connection layer; the second soldering partner has a second surface directly abutting against the connection layer; and the connection layer comprises a portion of intermetallic copper-tin phases of at least 90% by volume.

Further, a novel semiconductor chip is disclosed; the semiconductor chip comprises a semiconductor body with a surface, on which, starting from the semiconductor chip, a buffer layer, a diffusion barrier layer, and a copper-containing metal layer are arranged successively.

Further, a novel method for producing a power semiconductor module is disclosed; in the power semiconductor module a copper-containing (Cu) first soldering partner, a connection layer, and a copper-containing (Cu) second soldering partner are arranged successively, with the following steps: providing a copper-containing (Cu) first soldering partner, a tin-containing (Sn) solder, and a copper-containing (Cu) second soldering partner; arranging the solder between the first soldering partner and the second soldering partner; melting the solder by heating it to a temperature above its original melting point and below or equal to 415° C.; pressing the first soldering partner and the second soldering partner, as well as the solder arranged between the soldering partners against one another with a predefined pressure from 0.5 N/mm² to 3 N/mm²; and maintaining the temperature of the solder during pressing above its melting point and below or equal to 400° C. for a period of at least 0.1 seconds to 10 seconds.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
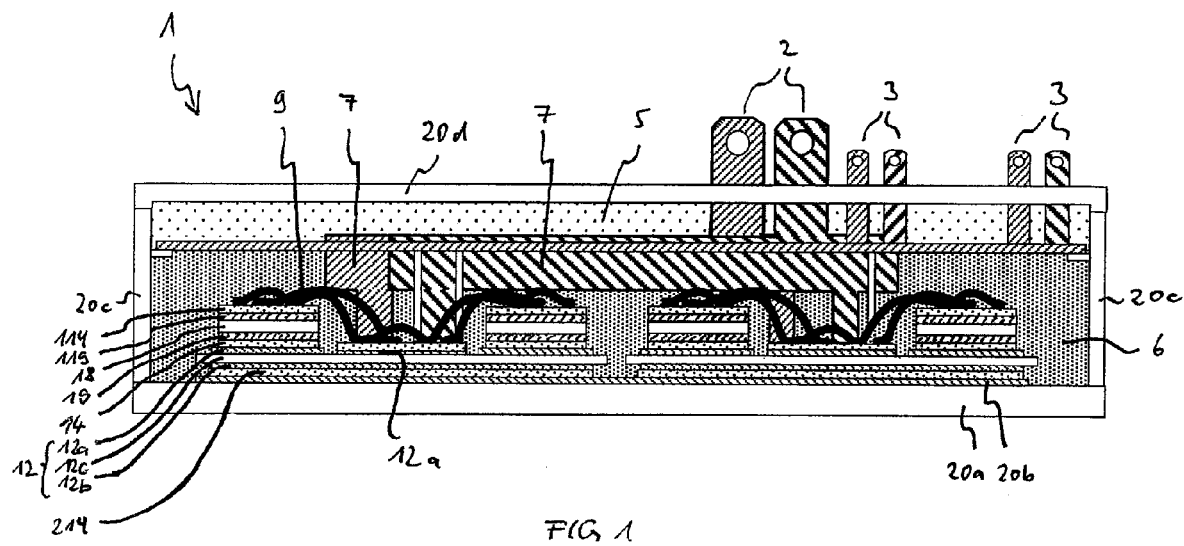
FIG. 1 is a vertical cross-sectional view through a power semiconductor module with a plurality of soldered joints, which each comprise a connection layer with a portion of at least 90% by volume of intermetallic copper-tin phases.

FIG. 1 is a vertical cross-sectional view through a power semiconductor module 1 with a plurality of soldered joints, wherein pairs of copper-containing soldering partners 20b/12b, 12a/19, 119/9 are each joined by a connection layer 214, 14 or 114, respectively, located therebetween. The connection layers 214, 14 or 114, respectively, each comprise a portion of at least 90% by volume of intermetallic copper-tin phases.

The power semiconductor module 1 comprises a base plate 20a with a copper-containing coating 20b, on which a substrate 12 is arranged. Instead of a copper-containing coating 20b, provision may also be made for a base plate comprising copper or being composed of copper.

The substrate 12 comprises an electrically insulating, highly heat-conducting carrier 12c, for example a ceramic, such as $Al_2O_3$, on which a structured metal layer 12a comprising copper or being composed of copper, and a metal layer 12b comprising copper or being composed of copper, are arranged on sides located opposite one another.

On each of these substrates 12, one or several semiconductor chips are arranged with a semiconductor body 18, which comprises chip metallizations 19, 119 at least on one of two sides located opposite one another. The semiconductor chips are contacted by means of contact wires 9 on the side facing away from the substrate 12. The contact wires 9 may be electrically connected and/or mechanically joined with sections of the structured metallization 12a, with the metallization of further semiconductor chips on the same or another substrate 12, with a metallic bus bar 7 for joining two or more substrates 12, with external load connections 2 or with external control connections 3.

The base plate 20a with its coating 20b forms a housing of the power semiconductor module 1 together with side walls 20c, as well as with a front wall 20d. For protection against environmental influences, particularly against the permeation of humidity and dirt, as well as for increasing the insulation property, the power semiconductor module 1 optionally is cast as well with a soft sealing compound 6 as with a hard sealing compound 5. The soft sealing compound 6 extends, starting from the base plate 20a and its coating 20b, at least beyond the upper surface of the semiconductor chip. The hard sealing compound 5 is arranged above the soft sealing compound 6 on the side thereof facing away from the base plates 20a, 20b. An enlarged section of the power semiconductor module 1 according to FIG. 1 prior to the casting is shown in FIG. 2 in more detail.

Figure 2:
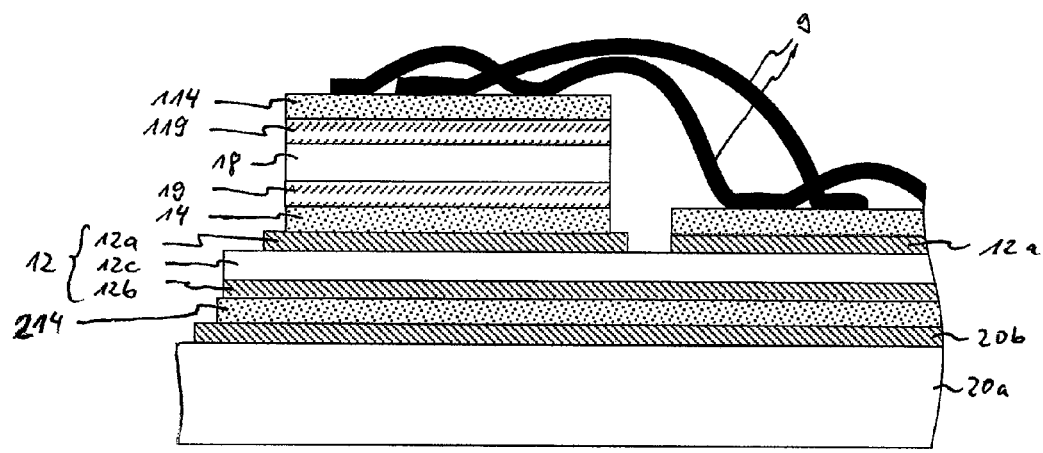
FIG. 2 is a vertical cross-sectional view through an enlarged section of a substrate of the power semiconductor module according to FIG. 1, fitted with a semiconductor chip.

The production of a power semiconductor module 1 according to FIGS. 1 and 2 is effected in a plurality of steps. In a first step, a substrate 12 is fitted with one or a number of semiconductor chips. For this, provision is made for a respective connection layer 14, which abuts against a metallization 19 on the lower side of the semiconductor body 18 of the semiconductor chip, as well as against the metallization 12a at the upper side of the substrate 12. The substrates 12 fitted in such a manner each form a unit. To be electrically contacted, the semiconductor chips of the fitted substrates 12 may, in an optional second step, be connected at their upper side by means of contact wires 9.

In a third step, one or more substrates 12 each optionally fitted with semiconductor chips are fixedly joined with the base plate 20a, 20b by means of a connection layer 214. Instead of a common connection layer 214 one or more substrates 12 may comprise individual connection layers.

The connection layers 14, 114, 214 each comprises a portion of at least 90% by volume of intermetallic copper-tin phases. The copper for the formation of the intermetallic copper-tin phases thereby emanates at least substantially out of the soldering partners, which are to be joined with one another and which directly abut against the respective connection layer 14, 114, 214. In the case of the connection layer 14, these partners are the metallization 12a and the chip metallization 19. In the case of the connection layer 114, these partners are the chip metallization 119 at the upper side and the contact wires 9, and, in the case of the connection layer 214, the metallization 12b at the lower side of the substrate 12 and the base plate 20a, 20b. The contact wires 9 comprise copper, e.g. in the form of a copper coating, of an alloy, or may consist of copper.

The production of connections by means of such connection layers 14, 114, 214 having at least 90% by volume of intermetallic copper-tin phases will be explained below in an exemplary manner by means of a semiconductor chip according to FIG. 3, which is mechanically joined with and electrically connected to a metallization 12a at the upper side of a substrate 12 according to FIGS. 1 and 2 in a number of steps illustrated in FIG. 4.

Figure 3:
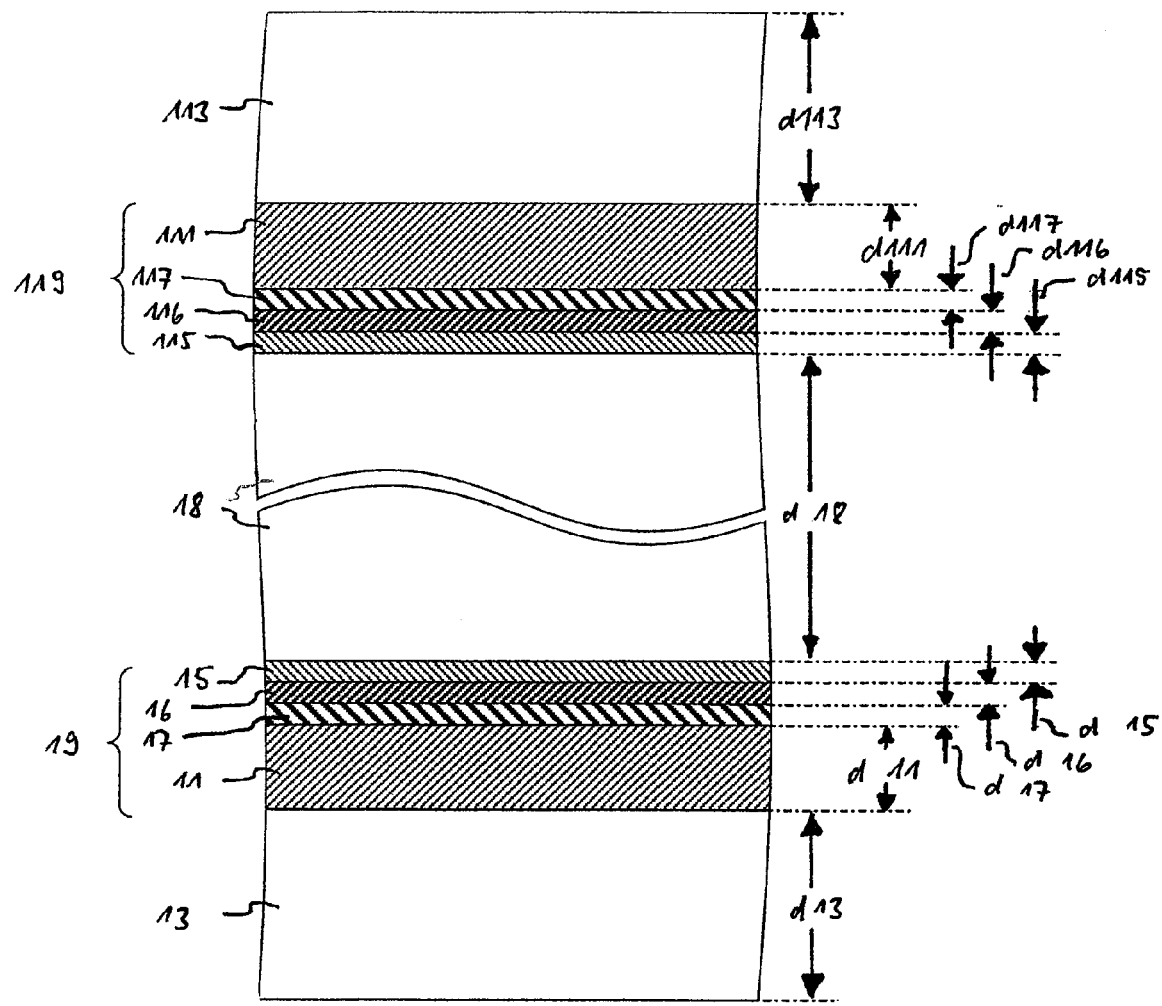
FIG. 3 is a vertical cross-sectional view through a section of a not yet installed semiconductor chip, on which a copper-containing metal layer and, directly abutting thereon, a tin-containing solder layer are arranged.

FIG. 3 is a vertical cross-sectional view through a section of a semiconductor chip having a semiconductor body 18, which, starting at its lower side, is provided with a chip metallization 19 in which an optional buffer layer 15, an optional diffusion barrier layer 16, an optional seed layer 17, and a copper-containing metal layer 11 are arranged successively. The buffer layer 15 ensures that thermomechanical stresses are removed from the connection layer and relieved within the thickness of said layer. The diffusion barrier layer 16 ensures that an unwanted interdiffusion of atoms into the active area of the semiconductor leads to a change of its electrical parameters. Instead of a buffer layer 15 and a diffusion barrier layer 16 a single layer combining a buffer function and a diffusion barrier function may be provided.

A tin-containing solder layer 13 is applied directly onto the copper-containing metal layer 11. Accordingly, the upper side of the semiconductor body 18, starting from the semiconductor chip, is provided with a chip metallization 119, in which an optional buffer layer 115, an optional diffusion barrier layer 116, an optional seed layer 117, and a copper-containing metal layer 111 are arranged successively. It shall be pointed out that except one of all copper-containing metal layers 11 and 111 of the semiconductor chip are optional. A tin-containing solder layer 113 is applied directly onto the copper-containing metal layer 111.

Alternatively, at least one of the solder layers 13 or 113 may, instead of being applied to a metal layer 11, 111, respectively, or to a chip metallization 19 or 119, respectively, be applied to a predetermined soldering partner, e.g. as depicted in FIGS. 1 and 2, to a metal layer 12a of substrate 12 or to a bond wire 9. The solder layers 13, 113 may, for example, be created by means of vapor deposition, sputtering, or by galvanic deposition. The copper-containing metal layers 11, 111 are designated to provide copper, which diffuses from the metal layers 11, 111 into the fused solder layers 13 or 113, respectively, which directly abut on the metal layers 11, 111, for the purpose of forming intermetallic copper-tin phases.

The semiconductor chip 18 has a thickness d18, the buffer layers 15, 115 have thicknesses d15 or d115, respectively, the diffusion barrier layers 16, 116 have thicknesses d16, d116, the seed layers 17, 117 have thicknesses d17, d117, the copper-containing metal layers 11, 111 have thicknesses d1 or d111, respectively, and the tin-containing solder layers 13, 113 have thicknesses d13 or d113, respectively.

The buffer layer 15 and/or the buffer layer 115 may, for example, comprise aluminum (Al) or may be composed of aluminum (Al). The thickness d15 of the buffer layer 15 and/or the thickness d115 of the buffer layer 115 may be, for example, from 200 nm to 700 nm, e.g. about 400 nm.

The diffusion barrier layer 16 and/or the diffusion barrier layer 116 may each comprise exactly one, exactly two, or a number of the substances titanium (Ti), titanium nitride (TiN), titanium tungsten (TiW), tantalum (Ta), tantalum nitride (TaN) or they may be composed of at least one of these materials.

The thicknesses d16 of the diffusion barrier layer 16 and/or d116 of the diffusion barrier layer 116 may, e.g., be from 50 nm to 600 nm. For example, the diffusion barrier layer 16 and/or the diffusion barrier layer 116 may comprise titanium (Ti) or may be composed of titanium (Ti) and may have a thickness d16 or d116, respectively, from 300 nm to 500 nm, e.g. 400 nm.

The optional seed layers 17 and 117 are each arranged between a barrier layer 16 and 116, respectively, and one of the metal layers 11 or 111, respectively, and may each comprise at least one of the materials silver (Ag), gold (Au), nickel (Ni), nickel vanadium (NiV) or copper (Cu) or they may be composed of at least one of these substances. The thicknesses d17 and/or d117 of the seed layers 17 or 117, respectively, may be, for example, from 50 nm to 200 nm. In particular, with thicknesses d17 or d117, respectively, from 100 nm to 200 nm, the seed layers 17 and/or 117 may comprise copper (Cu) or may be composed of copper (Cu).

For example, the seed layer 17 and/or the seed layer 117 may comprise silver (Ag) or may be composed of silver (Ag) and thereby have a thickness from 50 nm to 100 nm. The metal layer 11 and/or the metal layer 111 comprise copper (Cu) or are composed of copper (Cu) and may thereby have a thickness d11 or d111, respectively, from 1 µm to 30 µm.

The solder 13 and/or the solder 113 may, for example, be composed of pure tin (Sn) or may be embodied as tin-containing alloy, which comprises exactly one, exactly two, or more than two of the substances from the group silver (Ag), copper (Cu), nickel (Ni), indium (In), bismuth (Bi), zinc (Zn), antimony (Sb), germanium (Ge) or lead (Pb). In particular, the solder 13 and/or the solder 113 may be embodied as tin-containing alloy and may comprise a portion of silver (Ag) from 0.1% by weight to 6% by weight or from 1% by weight to 5% by weight, e.g., 3.5% by weight.

For example, if the surface roughness of the metal layers 11 and/or 111, respectively, is small compared with 1 µm, the thickness d13 of the corresponding solder layer 13 and/or the thickness d113 of the solder layer 113 may be chosen to be less than or equal to 10 µm, e.g. from 5 µm to 15 µm, from 4 µm to 13 µm, from 3 µm to 11 µm or from 2 µm to 9 µm. Thicknesses d13 and/or d113 from 5 µm to 10 µm are suited, e.g., if the surface of a soldering partner, with which the respective solder layer 13 or 113 is to connect the semiconductor chip with, has a surface roughness $R_z$, from 8 µm to 10 µm. For example, for a surface roughness $R_z$, of the soldering partner from 6 µm to 8 µm, a thickness d13 or d113 of the solder layer 13 or 113, respectively, from 4 µm to 13 µm is particularly suitable, for a surface roughness $R_z$, of the soldering partner from 4 µm to 6 µm, a thickness d13 or d113 of the solder layer 13 or 113, respectively, from 2 µm to 9 µm is particularly suitable. The way how to determine the surface roughness $R_z$, will be described in more detail in FIG. 10.

If a metal layer 11, 111 has a surface roughness Rz1 on its side facing to the respective solder layer 13, 113 of more than or equal to 1 µm, the thickness d13, d113 of the respective solder layer 13, 113 may be chosen thicker than in the above mentioned case of a substantially smooth metal layer. The following table shows, in µm, possible values for the thickness d13, d113 of a solder layer 13, 113 which is to be soldered to a solder partner, depending of the surface roughness Rz1 of the metal layer 11, 111 and the surface roughness Rz2 of the solder partner:

| Rz2 | Rz11 | | | |
| --- | --- | --- | --- | --- |
|  | <4 | 4 to 6 | 6 to 8 | 8 to 10 |
| <4 | 4 to 18 | 5 to 20 | 6 to 22 | 7 to 24 |
| 4 to 6 | 5 to 20 | 6 to 22 | 7 to 24 | 8 to 26 |
| 6 to 8 | 6 to 22 | 7 to 24 | 8 to 26 | 9 to 28 |
| 8 to 10 | 7 to 24 | 8 to 26 | 9 to 28 | 10 to 30 |

FIG. 4a shows a section of the semiconductor chip of FIG. 3 comprising the semiconductor body 18 and the metallization 19 at the lower side thereof, as well as the solder layer 13 applied to the metallization 19. The solder layer 13 is arranged between the copper-containing metal layer 11 and the copper-containing metallization 12a of a substrate 12 according to FIGS. 1 and 2. The metallization 12a has a thickness d12 and has a large surface roughness $R_z$, on an upper surface facing towards the semiconductor body 18. The lower side of the metal layer 11 has a lower surface having a roughness which is low compared to the surface roughness $R_z$, of the metallization 12a. Therefore, the lower surface of the metal layer 11 is shown as substantially flat.

To produce a fixed and permanent joint between the metallization 11 of the semiconductor body 18 and the metallization 12a, the substrate 12 with its metallizations 12a, 12b is heated, according to FIGS. 1 and 2, to a temperature, which is higher than the melting point of the solder layer 13. Subsequently, the solder layer 13 and the metallization 12a are contacted by applying an external, predefined pressure $p_s$ and are pressed against one another. The predefined pressure may be, for example, more than 0 N/mm² and less than or equal to 5 N/mm², or from 0.5 N/mm² to 1 N/mm², or from 0.5 N/mm² to 3 N/mm². This creates a thermal contact between the heated metallization 12a and the solder layer 13, as shown in FIG. 4b, so that the solder layer melts and fills trenches 12e formed by the surface roughness of the metallization 12a, which is shown in FIG. 4c. The thickness d13 of the original solder layer 13 according to FIG. 3 is chosen in such a manner that sufficient solder 13 is available to completely fill the trenches 12e under the predefined pressure $p_s$ and, at the same time, to avoid that, during the pressing process, too much excessive solder laterally escapes from the intermediate space formed between the metallizations 11 and 12a.

Figure 4E:
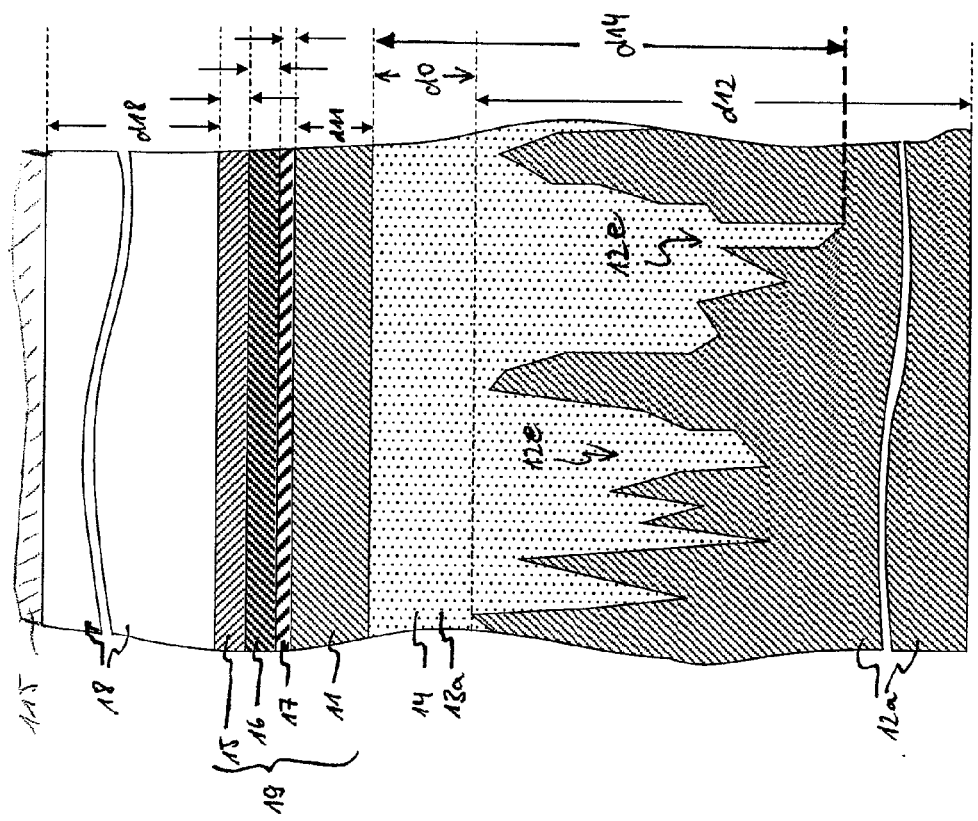
FIG. 4 is a vertical cross-sectional view of a semiconductor chip being soldered to a substrate of a power semiconductor module according to FIGS. 1 and 2, at different steps of the soldering process.

As can further be seen from FIG. 4c, a diffusion process takes place at the interfaces between the solder 13 and the copper-containing metallizations 11, 12a, which abut thereon, whereby copper 8 escapes from the metallizations 11, 12a and diffuses into the liquid solder 13, so that one or more intermetallic copper-tin phases are formed in sections 13a of solder 13. By maintaining the external pressure $p_s$ as well as the heat supply from the metal layer 12a, the diffusion of copper continues, so that the regions 13a having intermetallic copper-tin phases increase, and, associated therewith, regions 13b of the solder, which do not comprise tin converted into an intermetallic copper-tin phase, decrease, as can be seen from FIGS. 4c to 4e. As shown in FIG. 4d, continuous bridges 13d consisting only of intermetallic copper-tin phases, will form at places where the local distance between the soldering partners 11, 12a is minimal. As soon as at two locations spaced apart from one another two continuous bridges 13d have established, the soldering partners 11, 12a are interconnected and the pressure p may be reduced or removed. To continue the diffusion process of the copper 8 into the solder, the temperature of the solder may be maintained, e.g. below 415° C. and above the melting point of the original solder, for a predetermined duration, until enough solder, e.g. at least 90% by volume, has been converted into intermetallic copper-tin phases.

Figure 5:
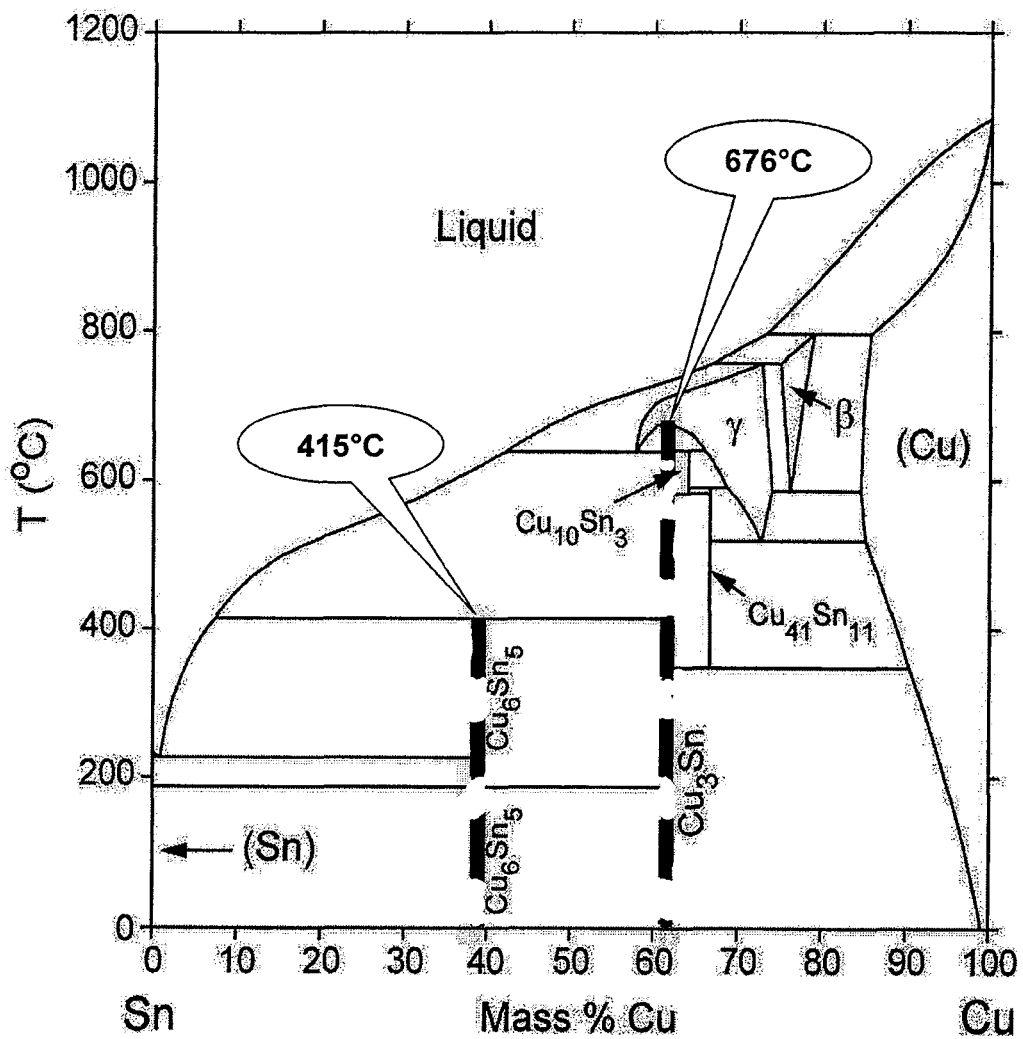
FIG. 5 is a phase diagram which illustrates the intermetallic copper-tin phases.

The melting point of the material in the regions 13a comprising intermetallic copper-tin phases is significantly determined by the melting point of that intermetallic copper-tin phase present in the regions 13a having the lowest melting point of all intermetallic copper-tin phases present in the regions 13a. Of all possible intermetallic copper-tin phases, the phase $Cu_6Sn_5$, with 415° C., has the lowest melting point, which can be seen from the phase diagram for intermetallic copper-tin phases according to FIG. 5. This means that the regions 13a with intermetallic phases according to FIGS. 4c to 4e have a melting point of at least 415° C., with a sufficiently high portion of the phase $Cu_6Sn_5$. Provided that the intermetallic phase $Cu_6Sn_5$ does not emerge, the melting point of the sections 13a according to FIGS. 4c and 4d actually lies at 676° C., which is the melting point of the intermetallic copper-tin phase $Cu_3Sn$.

If the melting of the solder 13 is effected at a temperature, which lies above the melting point of the solder 13 and below 415° C., due to the diffusion of copper and the formation of intermetallic copper-tin phases associated therewith, a solidification of the material in the sections 13a occurs. In so doing, it is possible to produce a connection layer 14 according to FIG. 4d, which has a melting point being higher than the temperature required for melting the solder layer 13. Once a portion of the tin contained in the liquid solder 13 is converted into one or more intermetallic copper-tin-phases at an amount being sufficient to produce a stable connection layer 14 at the temperature at hand, the external pressure $p_s$ may be decreased or withdrawn. Independent on whether or not a pressure $p_s$ is further exerted on the configuration, the diffusion and the formation of intermetallic copper-tin phases in the connection layer 14 associated therewith continues, until mostly all tin, e.g., at least 90% by volume, is converted into an intermetallic copper-tin phase.

To achieve a sufficiently high degree of conversion of tin into an intermetallic copper-tin phase, the thickness of the solder layer 13 applied onto the lower side of the semiconductor chip may be chosen to match the surface roughness of the metal layer 12a in such a manner that, after the liquefaction of the solder layer 13, the distance d0 (see FIGS. 4c to 4e) between the metal layers 11 and 12a establishing under the influence of the pressure $p_s$, is as short as possible, and that, nevertheless, all of the trenches 12e are basically completely filled. The shorter the distance d0, the smaller the section of the solder 13, through which the copper 8 escaping from the metallizations 11 and 12a must permeate, to effect the highest possible degree of conversion of the tin contained in the liquid solder 13 into an intermetallic copper-tin phase. The distance d0 may, e.g., be shorter than 1 µm, or, be equal to zero. Coming along with a high pressure $p_s$ and a short distance d0 the solder needs to be heated to a temperature above its melting point for a short duration only. Therefore, suitable pairs of such a duration and a pressure $p_s$ applied to the soldering partners, may be defined.

For example, at the same time, when the solder is heated for a predefined duration above its original melting point, i.e. above the melting point the solder has before the formation of copper-tin-phases starts, the pressure $p_s$ may be applied to the soldering partners and the solder arranged therebetween, to effect a minimum distance d0 between the soldering partners 11, 12a and to effect the formation of bridges 12d. The pressure $p_s$ may be, e.g., less than 5 N/mm² and the temperature of the solder, e.g., from above its original melting point to 415° C.

In the ideal case, all tin from the original solder 13 has been converted into one or more intermetallic copper-tin-phases, which may be seen from FIG. 4e.

FIGS. 6a to 6l generally show the production of a connection layer 14 between two copper-containing soldering partners 11, 12a of a power semiconductor module as a function of time t. According to FIG. 6a, copper-containing soldering partners 11a, 12a, as well as a tin-containing solder 13 are provided at a point in time t0. The solder 13 is arranged between the soldering partners 11 and 12a, and may be applied, for example, onto one or both of the sides of the soldering partners 11 and 12a, which are to be joined with one another, for example by means of vapor deposition, sputtering, or by galvanic deposition. At a point in time t0, the soldering partners 11, 12a, and the solder 13 are at ambient temperature, for example at room temperature.

Figure 6:
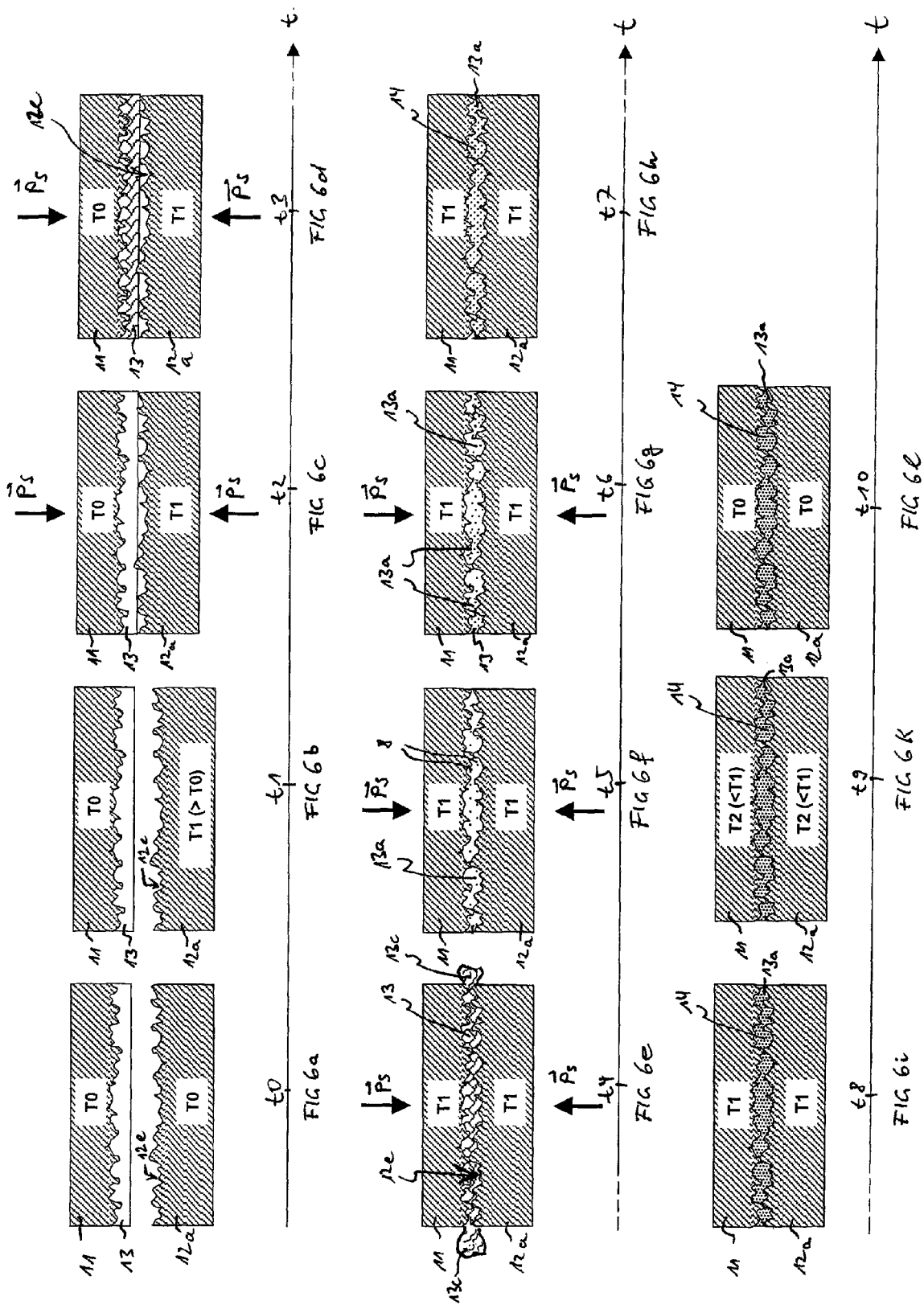
FIG. 6 is a vertical cross-sectional view of two soldering partners being soldered to one another, at different steps of the soldering process.

According to FIG. 6b, the soldering partner 12a is heated to a temperature T1, which is higher than the temperature t0 and higher than the melting point of the solder 13. According to FIG. 6c, the soldering partners 11 and 12a are subsequently, at a point in time t2, pressed against one another by means of a pressure $p_s$, whereby a thermal contact between the solder 13 and the soldering partner 12a is formed, so that the solder 13 is heated due to the higher temperature T1 of the soldering partner 12a, and is liquefied at a point in time t3, the result of which is shown in FIG. 6d.

As arises from FIG. 6e, the liquid solder 13, under the influence of the pressure $p_s$, permeates into the trenches 12e, which are formed by the surface roughness of the soldering partner 12a. At the same time, a displacement of excessive liquid solder 13c takes place from the opening existing between the soldering partners 11 and 12a. Furthermore, in the course of time, the temperature of the soldering partner 11 conforms to the temperature T1 of the soldering partner 12a.

Associated with the liquefaction of the solder 13, a diffusion process sets in, wherein copper 8 diffuses from the soldering partners 11 and 12a into the solder 13, so that the copper 8 with tin from the solder 13 forms one or a plurality of intermetallic copper-tin phases, the melting points of which being higher than the melting point of the original solder 13. As time t increases, more and more copper 8 diffuses into the solder layer 13, which can be seen from FIG. 6f to 6i, at points in time t5 to t8.

In the configuration according to FIG. 6h, the original solder layer 13 was already converted into a sufficiently stable connection layer 14, so that it was possible to remove the external pressure $p_s$ according to FIGS. 6c to 6g. To further advance the diffusion of cooper into tin components contained in the solder 13, which have not yet been converted into an intermetallic copper-tin phase, the temperature of the connection layer 14 and/or of the soldering partners 11, 12a abutting against the connection layer 14 is optionally maintained or at least held at a value being higher than the melting point of the original solder 13.

Once the connection layer 14 according to FIG. 6i has, at a point in time t8, a predefined portion of intermetallic copper-tin phases, e.g. of at least 90% per volume, the arrangement is cooled down to a temperature T2, which is lower than the temperature T1, the result of which can be seen from FIG. 6k at a point in time t9. After the further cooling of the configuration to ambient temperature T0, the soldering partners 11 and 12a are permanently joined with one another in a manner, which is stable to temperature changes at a point in time t10, as is shown in FIG. 6l.

Figure 7:
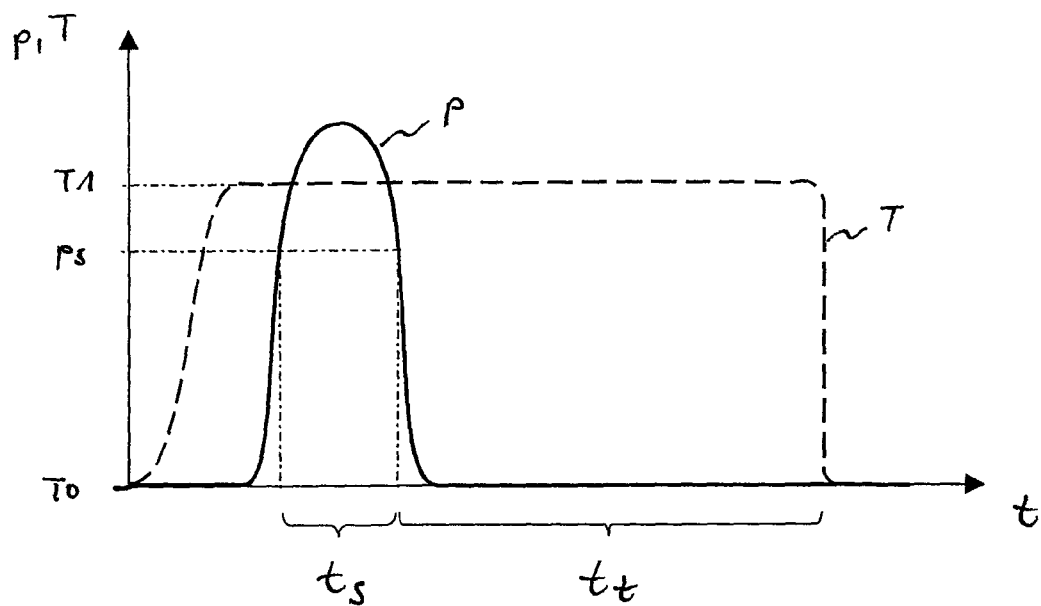
FIG. 7 is a diagram which illustrates a first example of a temporal characteristics of the temperature of a solder and of the pressure applied to the soldering partners during manufacturing a solder connection.
Figure 8:
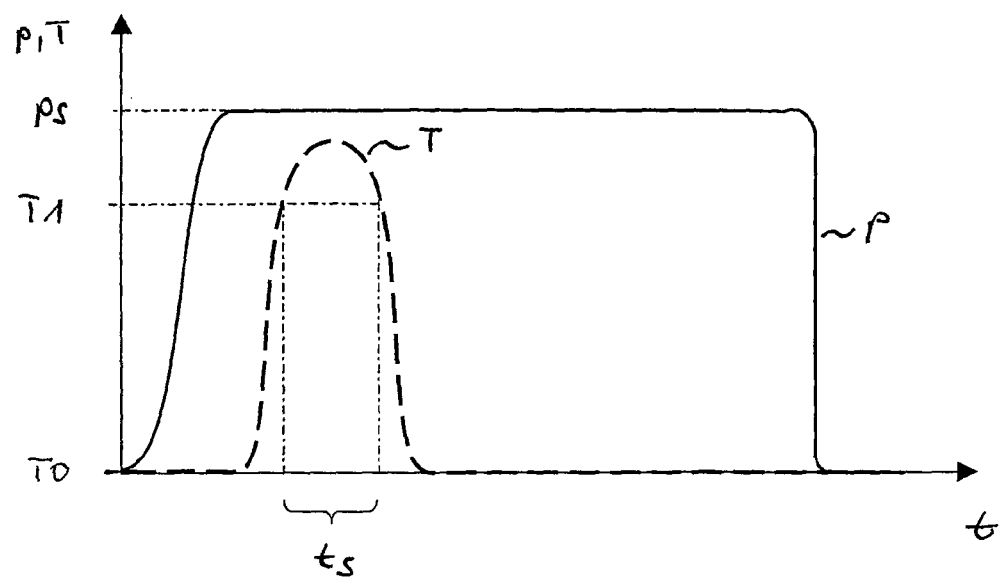
FIG. 8 is a diagram which illustrates a second example of a temporal characteristics of the temperature of a solder and of the pressure applied to the soldering partners during manufacturing a solder connection.

FIGS. 7 and 8 show examples of temporal characteristics of the temperature T of the solder and of the pressure p applied to the soldering partners during manufacturing a solder connection as described above. Starting from an ambient temperature T0, dependent on time t, the solder is heated to a predefined temperature T1. Further, pressure p is increased to a predefined pressure $p_s$. The characteristics of temperature T and pressure p are coordinated such that within a predefined time $t_s$ the solder has a temperature of T1 and the pressure p with which the soldering partners are pressed against one another is $p_s$.

In the example according to FIG. 7, temperature T reaches the predefined temperature T1 before pressure p reaches the predefined pressure $p_s$. Further, pressure p is reduced below the predefined pressure $p_s$ before temperature T is reduced below the predefined temperature T1. During a tempering time $t_t$ following the time $t_s$, the soldering partners and the solder may be tempered without external pressure p or with an external pressure p below the predefined pressure $p_s$ for a predefined duration $t_t$, e.g. from more than 0 sec to 120 sec, or 65 sec to 110 sec, at a temperature of less than 415° C., e.g., 400° C.

In the example according to FIG. 8, pressure p reaches the predefined pressure $p_s$ before temperature T reaches the predefined temperature T1. Further, temperature T is reduced below the predefined temperature T1 before pressure p is reduced below the predefined pressure $p_s$.

Similarly, the temperature T may reach the predefined temperature T1 before pressure p reaches the predefined pressure $p_s$ and temperature T is may be reduced below the predefined temperature T1 before pressure p is reduced below the predefined pressure $p_s$.

Also, pressure p may reach the predefined pressure $p_s$ before temperature T reaches the predefined temperature T1 and pressure p may be reduced below the predefined pressure $p_s$ before temperature T is reduced below the predefined temperature T1

Within the time $t_s$, temperature T shall not fall below the predefined temperature T1 and pressure p shall not fall below the predefined pressure $p_s$. The predefined temperature T1 may be, e.g., from the original melting point of the used solder to 415° C. and the predefined pressure, e.g., from 0.5 N/mm² to 5 N/mm². The predefined time $t_s$ may be, e.g., from 0.1 sec to 5 sec.

Figure 9:
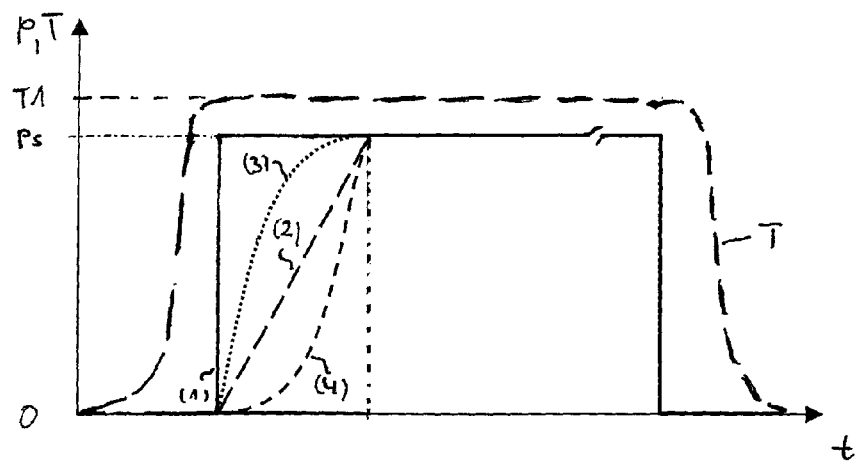
FIG. 9 is a diagram which illustrates different temporal characteristics of the pressure applied to the soldering partners during manufacturing a solder connection.

FIG. 9 shows different temporal characteristics of the pressure applied to the soldering partners during manufacturing a solder connection. The external pressure p applied to the soldering partners 11, 12a may start from 0 N/mm² and rise to $p_s$, e.g., with an almost vertical slope (1), linearly (2), curved right (3) or curved left (4). Over a period of time $t_s$, in which both the temperature T is T1 and the pressure p is p1, first bridges 13d (see FIG. 4d) form. Then, a period of time $t_t$ follows, in which the temperature T is maintained below 415° C., e.g., between the solder's original melting point and below or equal to 415° C., and the diffusion process is continued. The pressure p1 may also be maintained after during the period of time $t_t$, e.g. 0 sec to 120 sec.

Figure 10:
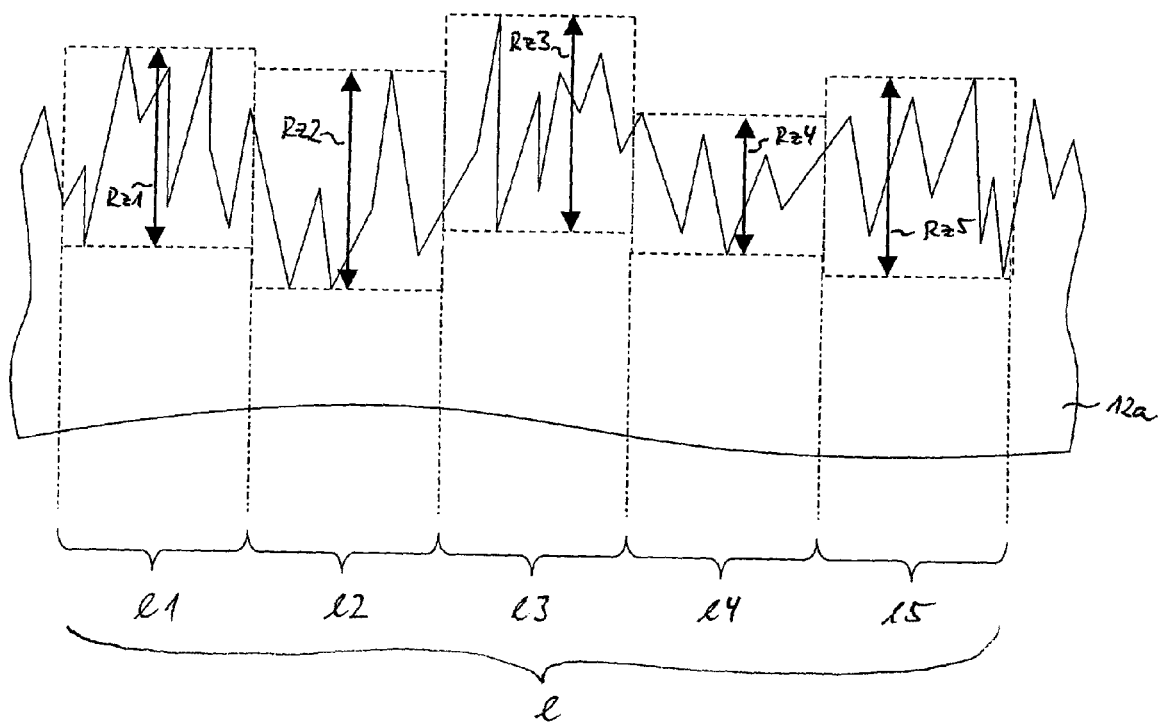
FIG. 10 is an illustration for explaining how to evaluate the surface roughness $R_z$, by example of a metallization of a substrate.

FIG. 10 illustrates how to evaluate the surface roughness $R_z$, which is defined according to DIN EN ISO 1302 (06/02) by example of a metallization of a substrate as described above. First, a predefined measuring length l along the surface of the metallization is subdivided into five sections 11, 12, 13, 14 and 15 having equal lengths. Then, within each of these five consecutive sections 11, 12, 13, 14 and 15 the peak-to-valley difference Rz1, Rz2, Rz3, Rz4 and Rz5, respectively, is determined. The surface roughness $R_z$ is the average of the five peak-to-valley differences Rz1, Rz2, Rz3, Rz4 and Rz5.

The present invention allows for the first time a unique technology to mount a semiconductor chip onto a metallization of a substrate, e.g. a ceramic substrate, the metallization having a large surface roughness $R_z$ of, e.g., 10 μm, for a reliable application at an ambient temperature of about 200° C. or above. In addition, this technology leads to a reduction of the heat transmission resistance of the connection layer.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

What is claimed is:

1. A power semiconductor module, in which a copper-containing first soldering partner, a connection layer, and a copper-containing second soldering partner are arranged successively and soldered together, wherein:
   the copper-containing first soldering partner has a first surface directly abutting against the connection layer;
   the copper-containing second soldering partner has a second surface directly abutting against the connection layer; and
   the connection layer has a portion of intermetallic copper-tin phases of at least 90% by volume, wherein the connection layer comprises a tin-containing solder disposed between the copper-containing first and second soldering partners, the tin-containing solder including copper from the copper-containing first and second soldering partners.

2. The power semiconductor module according to claim 1, wherein the first surface and/or the second surface have a surface roughness $R_z$ of less than or equal to 10 μm.

3. The power semiconductor module according to claim 1, wherein the first surface and/or the second surface have a surface roughness $R_z$ of less than 4 μm.

4. The power semiconductor module according to claim 1, wherein the first surface and/or the second surface have a surface roughness Rz from 4 μm to 6 μm.

5. The power semiconductor module according to claim 1, wherein the first surface and/or the second surface have a surface roughness Rz from 6 μm to 8 μm.

6. The power semiconductor module according to claim 1, wherein the first surface and/or the second surface have a surface roughness Rz from 8 μm to 10 μm.

7. The power semiconductor module according to claim 1, wherein the connection layer comprises at least one of the intermetallic copper-tin phases $Cu_6Sn_5$, $Cu_3Sn$, $Cu_{10}Sn_3$, $Cu_{41}Sn_{11}$.

8. The power semiconductor module according to claim 1, wherein the connection layer only comprises the intermetallic copper-tin phases $Cu_6Sn_5$ and $Cu_3Sn$.

9. The power semiconductor module according to claim 1, wherein the connection layer only comprises the intermetallic copper-tin phase $Cu_3Sn$.

10. The power semiconductor module according to claim 1, wherein at least 90% by volume of the connection layer has a melting point of at least 415° C.

11. The power semiconductor module according to claim 1, wherein at least 90% by volume of the connection layer has a melting point of at least 676° C.

12. The power semiconductor module according to claim 1, wherein the connection layer comprises a tin-based solder with a portion of 3.5% by weight of silver (Ag).

13. The power semiconductor module according to claim 8, wherein the connection layer comprises a tin-based solder with a portion of 0.1% by weight to 6% by weight of silver (Ag).

14. The power semiconductor module according to claim 1, wherein the connection layer comprises a tin-based solder, which is alloyed with one of the substances silver (Ag), copper (Cu), nickel (Ni), indium (In), bismuth (Bi), zinc (Zn), antimony (Sb), germanium (Ge) or lead (Pb).

15. The power semiconductor module according to claim 10, wherein the connection layer comprises a tin-based solder, which is alloyed with at least two of the substances silver (Ag), copper (Cu), nickel (Ni), indium (In), bismuth (Bi), zinc (Zn), antimony (Sb), germanium (Ge) or lead (Pb).

16. The power semiconductor module according to claim 1, wherein
   the copper-containing first soldering partner and/or the copper-containing second soldering partner comprises a copper portion of at least 70% by weight or is completely composed of copper.

17. The power semiconductor module according to claim 1, wherein
   the copper-containing first soldering partner and/or the copper-containing second soldering partner is embodied as a metallization of a semiconductor chip, as a copper disk, as a copper ribbon, as a contact wire, as a coating of a contact wire, as a clip, as a coating of a clip, as a circuit carrier for a semiconductor chip or as a coating for a circuit carrier of a semiconductor chip, or as a base plate or a coating for a base plate.

18. The power semiconductor module according to claim 1, wherein the copper-containing first soldering partner is embodied as base plate or as coating of a base plate of the power semiconductor module, and wherein the copper-containing second soldering partner is a substrate or a coating of a substrate.

19. The power semiconductor module according to claim 1, wherein
   the copper-containing first soldering partner and/or the copper-containing second soldering partner are substantially made of metal and has a thickness from 1 μm to 5 μm.

20. The power semiconductor module accordingly to claim 1, wherein a diffusion layer, a buffer layer, and semiconductor body are arranged successively on the copper-containing first soldering partner.

* * * * *

UNITED STATES PATENT AND TRADEMARK OFFICE
CERTIFICATE OF CORRECTION

Page 1 of 1

PATENT NO. : 9,214,442 B2
APPLICATION NO. : 11/688050
DATED : December 15, 2015
INVENTOR(S) : K. Guth et al.

It is certified that error appears in the above-identified patent and that said Letters Patent is hereby corrected as shown below:

IN THE CLAIMS

Column 11, line 15 (claim 20, line 1) please change "accordingly to" to -- according to --

Signed and Sealed this
Twelfth Day of April, 2016

Michelle K. Lee
*Director of the United States Patent and Trademark Office*